United States Patent [19]

Peregrim

[11] Patent Number: 5,578,790
[45] Date of Patent: Nov. 26, 1996

[54] SHIELDING GASKET

[75] Inventor: Walter A. Peregrim, Wilkes-Barre, Pa.

[73] Assignee: The Whitaker Corporation, Wilmington, Del.

[21] Appl. No.: 524,193

[22] Filed: Sep. 6, 1995

[51] Int. Cl.⁶ ........................................... H05K 9/00
[52] U.S. Cl. ................... 174/35 GC; 277/228; 277/229; 174/35 R
[58] Field of Search ............. 174/35 R, 35 GC, 174/35 MS; 277/80, 95, 96, 96.1, 96.2, 181, 186, 227, 228, 229, 230, 901, 207 R, 189

[56] References Cited

U.S. PATENT DOCUMENTS

| | | | |
|---|---|---|---|
| 4,857,668 | 8/1989 | Buonanno | 174/35 GC |
| 4,864,076 | 9/1989 | Stickney | 174/35 GC |
| 4,868,358 | 9/1989 | Yamasaki | 219/10.55 D |
| 4,898,760 | 2/1990 | Halberstadt et al. | 428/122 |
| 4,968,854 | 11/1990 | Benn, Sr. et al. | 174/35 GC |
| 5,028,739 | 7/1991 | Keyser et al. | 174/35 GC |
| 5,045,635 | 9/1991 | Kaplo et al. | 174/35 GC |
| 5,068,493 | 11/1991 | Benn, Sr. et al. | 174/35 GC |
| 5,105,056 | 4/1992 | Hoge, Jr. et al. | 174/35 GC |
| 5,107,070 | 4/1992 | Benn, Sr. et al. | 174/35 GC |
| 5,115,104 | 5/1992 | Bunyan | 174/35 GC |
| 5,142,101 | 8/1992 | Matsuzaki et al. | 174/35 GC |
| 5,202,536 | 4/1993 | Buonanno | 174/35 GC |
| 5,250,751 | 10/1993 | Yamaguchi | 174/35 GC |
| 5,390,939 | 2/1995 | Terauchi et al. | 277/227 |

FOREIGN PATENT DOCUMENTS

| | | | |
|---|---|---|---|
| 0218674 | 8/1993 | Japan | 174/35 GC |
| 0584896 | 3/1994 | Japan | 174/35 GC |

*Primary Examiner*—Bot L. Ledynh

[57] ABSTRACT

The invention comprises a shielding gasket for electrically sealing between a first and a second conductive panel. The gasket includes a resilient core having a securing side for securing to the first conductive panel, and an engaging side for engaging the second conductive panel. The core extends in a longitudinal direction and has a height. An electrically conductive sheath at least partially surrounds the core. A strip of adhesive is disposed along the securing side, the strip extends in the longitudinal direction along the core. An extension is along the securing side. The extension protrudes beyond the adhesive strip and runs along the longitudinal direction of the core, parallel to the adhesive, whereby the extension provides electrical contact to the first conductive panel at the same time as the adhesive secures.

13 Claims, 3 Drawing Sheets

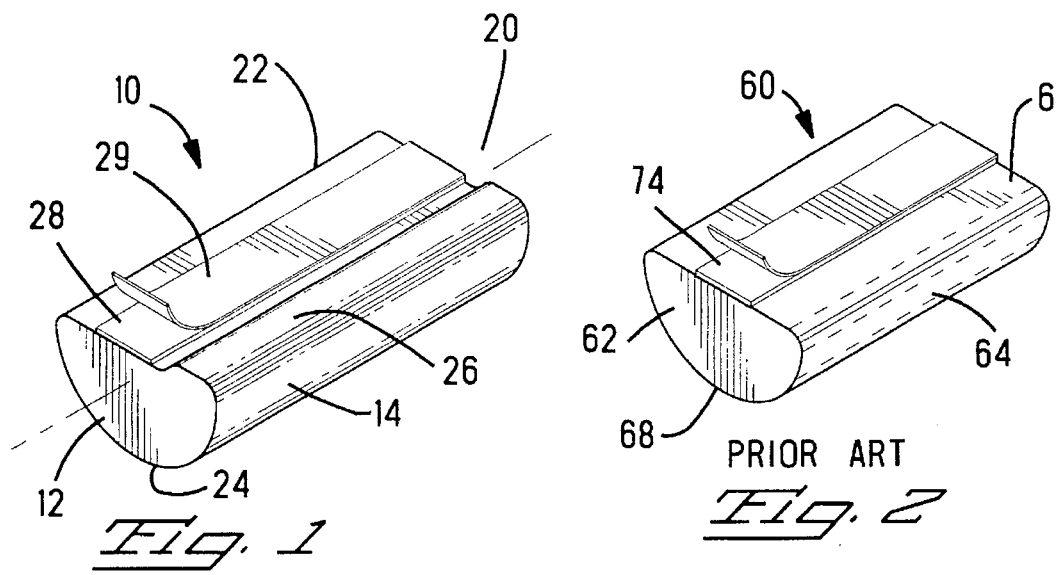
Fig. 1
Fig. 2 PRIOR ART
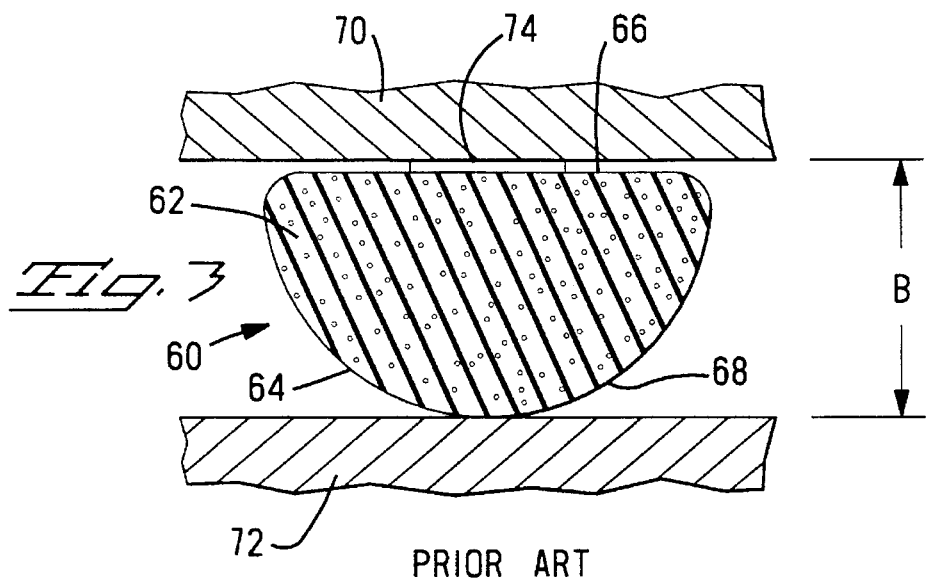
Fig. 3 PRIOR ART
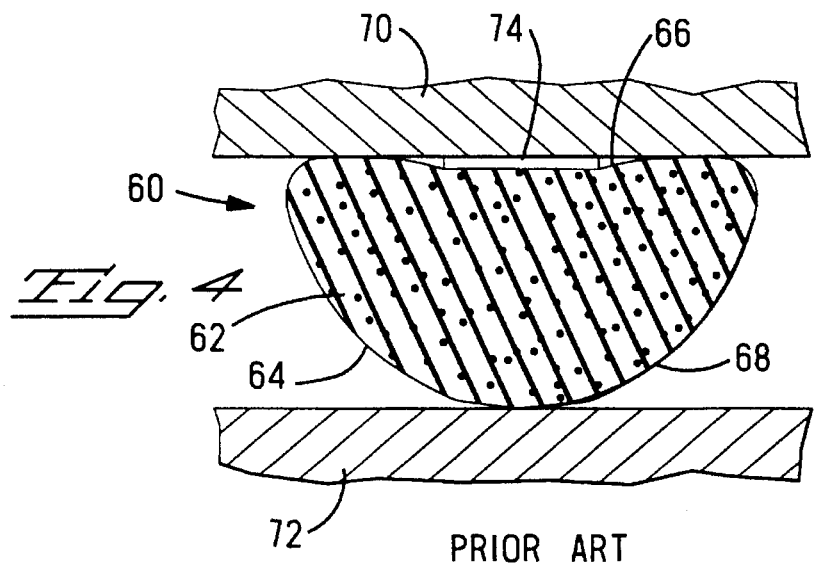
Fig. 4 PRIOR ART

SHIELDING GASKET

FIELD OF THE INVENTION

This invention relates generally to the field of gaskets and shields and more particularly to shields and gaskets for blocking electromagnetic radiation and radio frequency radiation which can cause electromagnetic interference (EMI) and radio frequency interference (RFI).

BACKGROUND OF THE INVENTION

Electrical apparatus are often placed in a shielded housing to protect the apparatus from radiation which can cause EMI/RFI in the apparatus and to protect leakage of radiation to the environment from the apparatus. The shielded housing is made from conductive panels which are secured together to form the housing. There are often gaps between even the best fitting panels through which radiation can pass. In order to seal any gaps between the panels, a gasket having an outer conductive layer is secured between the panels.

U.S. Pat. No. 4,857,668 discloses a gasket having a compressible foam core which is surrounded by a sheath. The sheath is an electrically conductive fabric which is secured to the foam core. The gasket is placed between the junction of two conductive panels to provide electrical connection therebetween and to seal the junction from radiation leakage.

A typical design for the gasket has a D-shaped or a rectangular shaped cross section with an adhesive strip secured along one of the flat ends. When the gasket is placed between two parallel panels, the adhesive secures the gasket to a first panel and the opposite side of the gasket engages the second panel. However, the adhesive blocks the gasket from forming electrical contact with the first panel. In order to get good electrical conductivity between the gasket and the first panel, the gasket must be compressed so that edges of the gasket are compressed around the adhesive thereby providing electrical contact.

It would be an advantage to provide a gasket wherein a good electrical connection is formed without the need to compress the gasket between the panels.

SUMMARY OF THE INVENTION

The invention comprises a shielding gasket for electrically sealing between a first and a second conductive panel. The gasket includes a resilient core having a securing side for securing to the first conductive panel, and an engaging side for engaging the second conductive panel. The core extends in a longitudinal direction and has a height. An electrically conductive sheath at least partially surrounds the core. A strip of adhesive is disposed along the securing side, the strip extends in the longitudinal direction along the core. An extension is along the securing side. The extension protrudes beyond the adhesive strip and runs along the longitudinal direction of the core, parallel to the adhesive. Whereby the extension provides electrical contact to the first conductive panel at the same time as the adhesive secures.

BRIEF DESCRIPTION OF THE DRAWINGS

An embodiment of the present invention will be described by way of example with reference to the accompanying drawings, in which:

FIG. 1 is an isometric view of the gasket of the current invention;

FIG. 2 is an isometric view of a prior art gasket;

FIGS. 3 and 4 are cross sectional views showing the prior art gasket between two conductive panels;

DETAILED DESCRIPTION OF THE DRAWINGS

Figure 5:
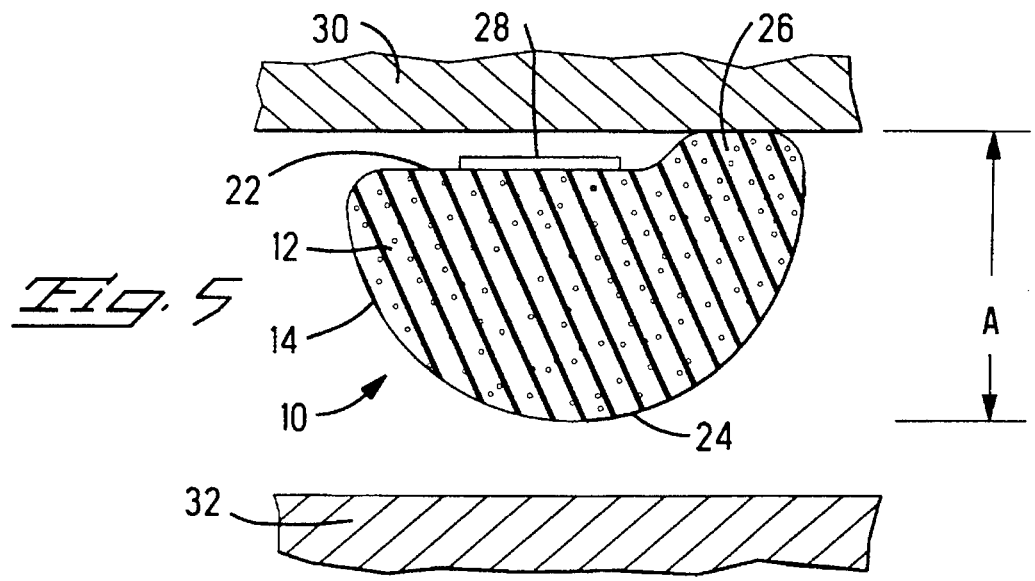
FIGS. 5, 6 and 7 are cross sectional views showing engagement of the gasket of the present invention with the panels.

FIG. 1 shows the gasket of the current invention. The gasket 10 is comprised of a rubber extrusion core 12. The core 12 is compressible and retains memory of its original shape so that it returns to its original shape following compression and release. The core 12 is surrounded by an electrically conductive sheath 14. The sheath can be made from a variety of materials. Some examples are metallized fabrics, braids, or meshes. An example of these types of materials are FLECTRON METALLIZED MATERIALS by Monsanto. The sheath 14 is flexible and moves with the compression and relaxation of the core 12. The sheath 14 is typically adhered to the core by transfer adhesive, but it could be secured to the core in various ways that would prevent the core from moving within the sheath.

The gasket extends longitudinally along the axis 20 and can be formed to any length that is necessary for the particular application. The gasket 10 has generally a D-shaped cross section. The D-shape comprises a flat surface 22 and a rounded surface 24. Along one edge of the flat surface 22 is a nub 26 which extends outwardly from the flat surface 22 and away from the rounded section 24, see FIG. 5. The gasket has an original, uncompressed height A which extends from the nub 26 to the furthermost edge of the rounded surface 24.

The flat surface 22 also has an adhesive strip 28 which is situated approximately in the center of the gasket 10. The adhesive strip extends along the length of the gasket and is a double sided transfer adhesive which is secured to the gasket 10 and can secure the gasket 10 to a conductive panel. A release paper 29 overlies the adhesive to protect the adhesive until it is needed. The release paper 29 can be peeled away revealing the adhesive for mounting to a panel.

FIGS. 2, 3 and 4 show a prior art gasket 60. The gasket 60 has a core 62 and an electrically conductive sheath 64. The gasket 60 has a D-shaped cross section with a flat surface 66 and a rounded section 68. Along the flat surface 66, a double sided transfer adhesive 74 is disposed along the flat surface to secure the gasket 60 to a first conductive panel 70. The gasket 60 has an original, uncompressed height B, which is the thickest part of the gasket 60, see FIG. 3.

When the gasket 60 is secured to a first conductive panel 70, the transfer adhesive 74 prevents the gasket 60 from making immediate electrical contact with the first panel 70, see FIG. 3. When the second panel 72 is brought into contact with the gasket 60, there will be initial electrical contact with the second panel, however, there the gasket 60 is still not in contact with the first panel 70. As the second panel 72 is brought into contact with the gasket 60, the panel 72 will compress the gasket. While the gasket is being compressed, edges of the gasket will deform around the adhesive and then come into contact with the first panel 70 as is shown in FIG. 4. The gasket must be compressed to less than approximately 75% of its original height B in order to form good contact with the first panel 70.

Figure 6:
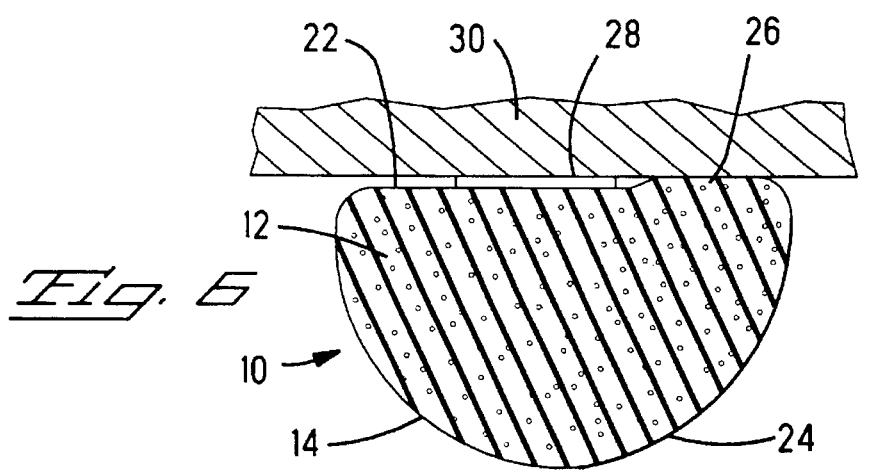
Figure 7:
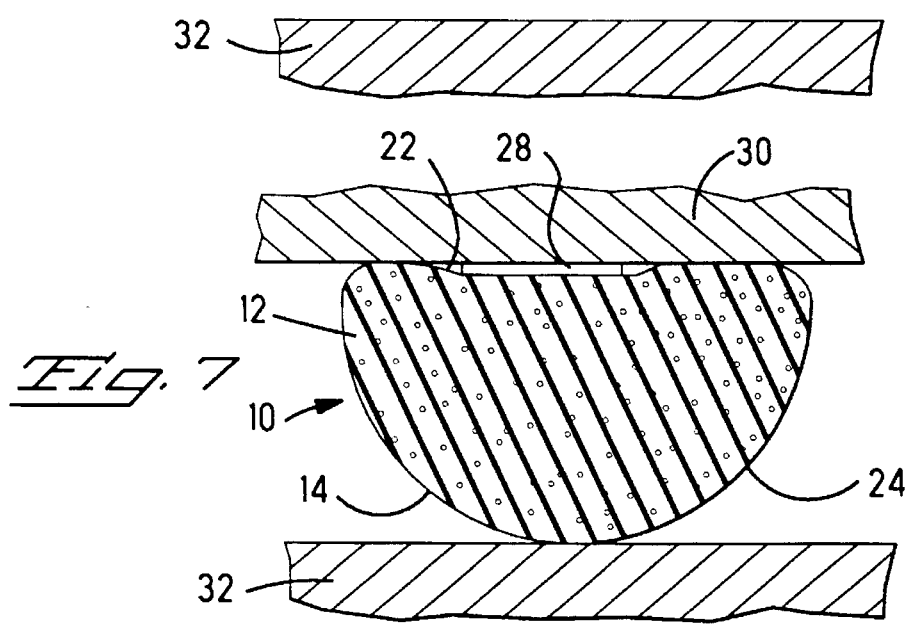

FIGS. 5, 6, and 7 show the gasket 10 of the present invention being secured between a first conductive panel 30 and a second conductive panel 32. The transfer adhesive strip 28 is used to secure the gasket 10 to the first conductive panel 30. When the adhesive is secured to the first conductive panel 30, the nub 26 becomes compressed against the panel 30 and is therefore in contact with the panel. When the second conductive panel 32 is brought toward the first panel, the panel engages the rounded section 22 of the gasket 10 thereby providing electrical connection to the second conductive panel 32. Because the nub 26 extends beyond the flat section 22, no deformation of the gasket 10 around the adhesive strip 28 is needed in order to establish good electrical contact, only minimal deformation of the nub 26 during the initial mounting of the gasket 10 to the panel 30 is necessary. The nub 26 provides good electrical contact to the first panel 30 prior to compression. The nub 26 makes electrical contact when the gasket 10 is greater than approximately 95% of its uncompressed height. Therefore, little or very minimal compression of the gasket is needed in order to provide good electrical sealing between the conductive panels.

Figure 8:
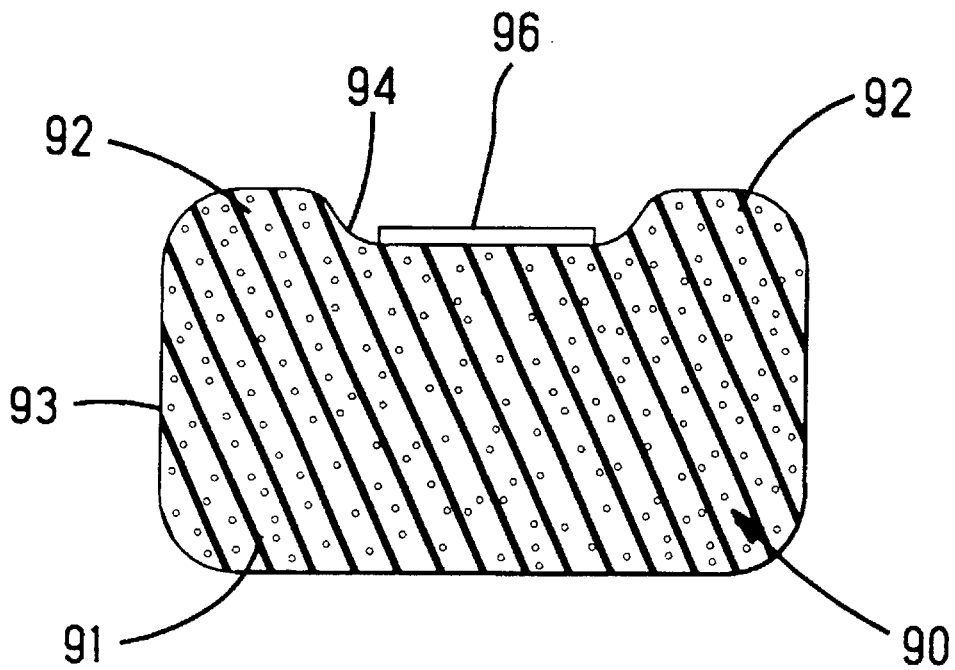
FIGS. 8 and 9 are cross sectional views showing alternative embodiments of the present invention.
Figure 9:
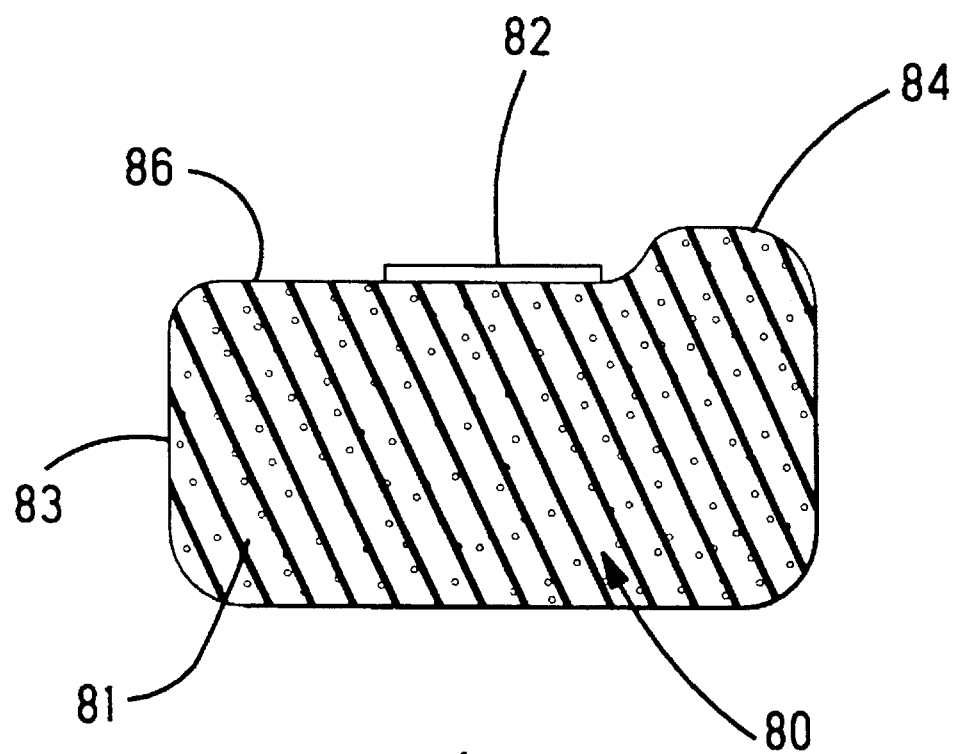

FIGS. 8 and 9 show alternative embodiments of the present invention. FIG. 9 shows a gasket 80 which has a rectangular cross section. The gasket 80 has a resilient core 81 and a conductive sheath 83 surrounding the core. The mounting adhesive 82 and the nub 84 are disposed along the same, substantially flat side 86 of the gasket 80. FIG. 8 shows a rectangular shaped gasket 90 having two nubs 92 along the same side 94. The gasket 90 includes a resilient core 91 with a conductive sheath 93 surrounding the core. The mounting adhesive 96 being disposed between the nubs 94, along the same side. Both gaskets 80, 90 have an engaging section which is opposite to the side on which the nubs 84, 92 are disposed. Other embodiments could include any shape which has a substantially flat surface on which the mounting adhesive is applied. Either one or two nubs could then be disposed adjacent to the mounting adhesive strip.

The shielding gasket thereby provides the advantage of providing electrical connection to conductive shields without compression of the gasket. In situations where the panels cannot provide enough force to compress the gasket, electrical contact will still be provided to both panels. Further, a smaller gasket can be used than is necessary for the prior gasket as the gasket does not need to be compressed to form a good electrical seal.

The shielding gasket of the present invention and many of its attendant advantages will be understood from the foregoing description. It is apparent that various changes may be made in the form, construction, and arrangement of parts thereof without departing from the spirit or scope of the invention, or sacrificing all of its material advantages.

I claim:

1. A shielding gasket for electrically sealing between a first and a second conductive panel, comprising:

a resilient core having a securing side for securing to the first conductive panel, and an engaging side for engaging the second conductive panel, the core extending in a longitudinal direction and having a height;

an electrically conductive sheath at least partially surrounding the core;

a strip of adhesive disposed along the securing side, the strip extending in the longitudinal direction along the core; and an extension along the securing side the extension protruding beyond the adhesive strip and running along the longitudinal direction of the core, parallel to the adhesive the extension providing in its place electrical contact to the first conductive panel at the same time as the adhesive secures.

2. The shielding gasket of claim 1, wherein the core has a D-shaped cross section and the securing side is substantially flat and the engaging side is rounded, the protrusion being disposed along one edge of the flat, securing side.

3. The shielding gasket of claim 1, wherein the core has a rectangular cross section and the securing side is substantially flat and the engaging side is an opposing flat side, the protrusion being disposed along one edge of the flat, securing side.

4. The shielding gasket of claim 3, wherein two protrusions extend along both sides of the adhesive strip.

5. The shielding gasket of claim 1, wherein the core is a rubber extrusion and the sheath is a flexible fabric which is secured around the exterior surface of the core.

6. The shielding gasket of claim 1, wherein the adhesive is a double sided transfer adhesive.

7. A shielding gasket, comprising:

a resilient core extending in a longitudinal direction and having a securing side with a protrusion therealong;

an electrically, conductive sheath encompassing at least a part of the core and the protrusion to provide electrical connection between a first conductive panel and a second conductive panel;

an adhesive extending in the longitudinal direction along the securing side, adjacent to the protrusion, wherein the adhesive has a height less than that of the protrusion such that the protrusion extends beyond the adhesive, the adhesive being used to secure the gasket to the first conductive panel to provide connection between the protrusion and the first conductive panel.

8. The shielding gasket of claim 7, wherein the core has a D-shaped cross section and the securing side is substantially flat and the engaging side is rounded, the protrusion being disposed along one edge of the flat, securing side.

9. The shielding gasket of claim 7, wherein the core has a rectangular cross section and the securing side is substantially flat and the engaging side is an opposing flat side, the protrusion being disposed along one edge of the flat, securing side.

10. The shielding gasket of claim 9, wherein two protrusions extend along both sides of the adhesive strip.

11. The shielding gasket of claim 7, wherein the core is a rubber extrusion and the sheath is a flexible fabric which is secured around the exterior surface of the core.

12. The shielding gasket of claim 7, wherein the protrusion is a portion of the core and the sheath extends around the protrusion.

13. The shielding gasket of claim 7, wherein the adhesive is a double sided transfer adhesive.

* * * * *